(12) United States Patent
Seshita

(10) Patent No.: US 9,692,410 B2
(45) Date of Patent: Jun. 27, 2017

(54) SEMICONDUCTOR SWITCH

(71) Applicant: KABUSHIKI KAISHA TOSHIBA, Tokyo (JP)

(72) Inventor: Toshiki Seshita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/875,288

(22) Filed: Oct. 5, 2015

(65) Prior Publication Data

US 2016/0277018 A1  Sep. 22, 2016

(30) Foreign Application Priority Data

Mar. 16, 2015  (JP) .................................. 2015-052568

(51) Int. Cl.
*H03K 17/693* (2006.01)
(52) U.S. Cl.
CPC .................................. *H03K 17/693* (2013.01)
(58) Field of Classification Search
None
See application file for complete search history.

(56) References Cited

U.S. PATENT DOCUMENTS

| | | | |
|---|---|---|---|
| 3,586,930 A | 6/1971 | Das et al. | |
| 4,763,183 A | 8/1988 | Ng et al. | |
| 5,945,867 A * | 8/1999 | Uda | H03H 11/38 327/389 |
| 7,636,004 B2 * | 12/2009 | Nakatsuka | H03K 17/102 327/308 |
| 8,583,111 B2 * | 11/2013 | Burgener | H01P 1/15 257/341 |
| 2006/0001473 A1 * | 1/2006 | Yasuda | H03K 17/693 327/415 |
| 2007/0018247 A1 * | 1/2007 | Brindle | H01L 29/78609 257/347 |
| 2009/0020848 A1 | 1/2009 | Ono et al. | |
| 2012/0112832 A1 | 5/2012 | Kawano et al. | |
| 2013/0015717 A1 * | 1/2013 | Dykstra | H03K 17/005 307/100 |
| 2013/0087828 A1 | 4/2013 | Koshimizu et al. | |

(Continued)

FOREIGN PATENT DOCUMENTS

| | | |
|---|---|---|
| JP | 2009-027487 A | 2/2009 |
| JP | 2012129813 A | 7/2012 |

*Primary Examiner* — Cassandra Cox
(74) *Attorney, Agent, or Firm* — Patterson & Sheridan, LLP

(57) ABSTRACT

In an embodiment, semiconductor switch includes first switches switching conduction between input-output nodes and a common node. One of the first switches includes a plurality of first transistors connected in series between an input and output node and the common node. Each of the plurality of first transistors includes first gate electrodes, a second gate electrode, a first and second region in a semiconductor layer having a same conduction type. The first gate electrodes extend in parallel in a first direction. The second gate electrode extending in a direction crossing the first direction and is connected to one end of the first gate electrodes. The second region in the semiconductor layer is disposed on a side of the second gate electrode opposite to the first gate electrodes.

13 Claims, 12 Drawing Sheets

(56) References Cited

U.S. PATENT DOCUMENTS

| | | | |
|---|---|---|---|
| 2014/0009214 A1* | 1/2014 | Altunkilic | H03K 17/161 327/427 |
| 2015/0381171 A1* | 12/2015 | Cebi | H03K 17/687 327/427 |
| 2016/0006409 A1* | 1/2016 | Keane | H03H 7/465 333/103 |

* cited by examiner (COMPARATIVE EXAMPLE)

1X

FIG. 8 (COMPARATIVE EXAMPLE)

$Rb1T > Rb2T > \cdots > Rb[k]T \geqq Rb[k+1]T \geqq \cdots \geqq Rb[p]T$ $Rb1S > Rb2S > \cdots > Rb[k]S \geqq Rb[k+1]S \geqq \cdots \geqq Rb[p]S$

SEMICONDUCTOR SWITCH

CROSS-REFERENCE TO RELATED APPLICATION

This application is based upon and claims the benefit of priority from Japanese Patent Application No. 2015-052568, filed Mar. 16, 2015, the entire contents of which are incorporated herein by reference.

FIELD

Embodiments described herein relate generally to a semiconductor switch.

BACKGROUND

In a high-frequency circuit of a mobile terminal such as a mobile telephone, a transmitting circuit and a receiving circuit are selectively connected to a common antenna via a high-frequency switching circuit (a semiconductor switch). A switching element in a high-frequency switching circuit can be a high electron mobility transistor (HEMT) which uses a compound semiconductor; however, because of its low cost and miniaturization, a metal oxide semiconductor field effect transistor (MOSFET) provided on a silicon substrate is widely used instead of the HEMT in such applications.

In a MOSFET type switching element provided on a normal silicon substrate, there is a problem with power loss of the high frequency signal being large since a parasitic capacitance between a source/drain electrode and the silicon substrate is large and the silicon substrate is a semiconductor. Thus, a technology of forming a high-frequency switching circuit on a silicon on insulator (SOI) substrate has been proposed.

In a global system for mobile communications (GSM®), a second harmonic distortion occurring in a high frequency switching circuit when an input power is 35 dBm is required to be −45 dBm or lower in a range from 800 MHz band to 900 MHz band.

In addition, in a mobile terminal which is equipped with a global positioning system (GPS) function and using the 1.5 GHz band, the second harmonic distortion occurring when an input power is 26 dBm is strictly required to be −84 dBm or lower in a range of frequency bands from 698 MHz to 798 MHz.

Further, there is also a maximum allowable input power of the high frequency switching circuit must also be considered.

DETAILED DESCRIPTION

An exemplary embodiment provides a semiconductor switch with good high frequency characteristics.

In general, according to one embodiment, a semiconductor switch includes: a support substrate; an insulating layer provided on the support substrate; a semiconductor layer provided on the insulating layer; and an i-th (i is a certain integer equal to or greater than 1 and equal to or less than n, and n is an integer of 2 or more) first switch that is provided on the semiconductor layer and switches conduction between an i-th input and output node and a common node. The i-th first switches may also be referred to collectively as first through i-th first switches. A first first switch includes a plurality of first metal-oxide-semiconductor field effect transistors (MOSFETs) that are connected in series between the corresponding first input and output node and the common node. Each of the plurality of first MOSFETs includes a plurality of first gate electrodes, a second gate electrode, a first region in the semiconductor layer, and a second region in the semiconductor layer that has a same conduction type as that of the first diffused region. The first region of the semiconductor layer can include dopants and may function as a source and/or drain region of the first MOSFET. The plurality of first gate electrodes are provided in parallel on the semiconductor layer and extend in a first direction. The second gate electrode is provided on the semiconductor layer, is connected to one end portion of each of the plurality of first gate electrodes in the first direction, and extends in a second direction intersecting with the first direction. The first region is provided on a surface of the semiconductor layer between the plurality of first gate electrodes. The second region is provided on the surface of the semiconductor layer positioned on a side opposite to the plurality of first gate electrodes with respect to the second gate electrode.

Hereinafter, the exemplary embodiments will be described with reference to the drawings. These exemplary embodiments are presented for purposes of explaining and demonstrating aspects of the present disclosure and not limitations on the present disclosure.

First Embodiment

Figure 1:
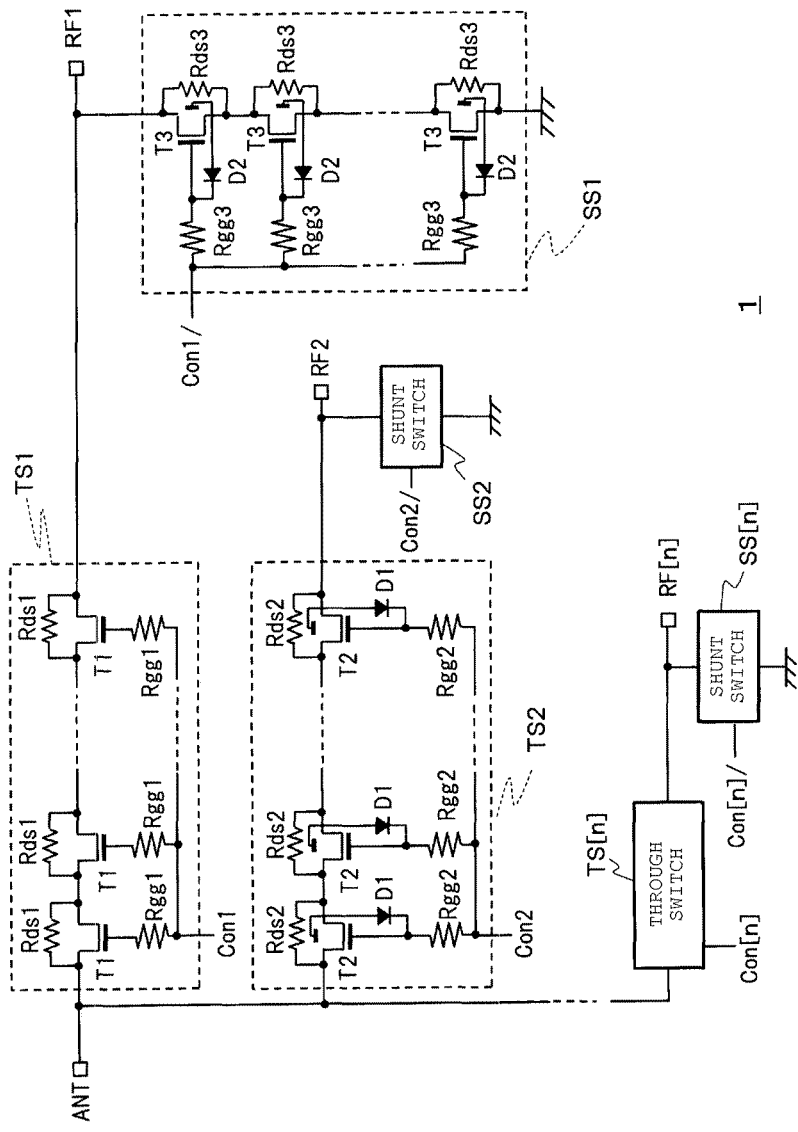
FIG. 1 is a circuit diagram of a semiconductor switch according to a first embodiment.

FIG. 1 is a circuit diagram illustrating a semiconductor switch 1 according to a first embodiment. The semiconductor switch 1 is a single-pole n-throw (SPnT) switch which is provided on a SOI substrate (in this instance, n is an integer of 2 or more). As illustrated in FIG. 1, the semiconductor switch 1 is provided with a first through-switch TS1 to an n-th through-switch TS[n] (collectively, "first switches"), and a first shunt switch SS1 to an n-th shunt switch SS[n] (collectively, "second switches").

An i-th through-switch TS[i] (where i is an integer 1 to n) switches whether to allow conduction between an i-th high-frequency signal terminal (an i-th input and output node) RF[i] and an antenna terminal (a common node) ANT based on a control signal Con[i].

The antenna terminal ANT is connected to, for example, an antenna. For example, a transmitting circuit that transmits a high-frequency signal or a receiving circuit that receives a high-frequency signal is connected to high-frequency signal terminals RF1 to RF[n].

An i-th shunt switch SS[i] switches whether to allow conduction between the i-th high-frequency signal terminal RF[i] and a reference potential node based on a control signal Con[i]/. A reference potential (a ground potential) is supplied to the reference potential node. In the present disclosure, the control signal Con[i]/ represents a logical inversion signal of the control signal Con[i], and the same is true for of other signals including the symbol "/" with respect to the signal name. Meanwhile, a node in the present disclosure includes not only a physical signal connection point such as a port or a terminal, but also a certain point on a signal wiring or an electrical connection having the same potential.

The first through-switch TS1 includes a plurality of first MOSFETs T1, a plurality of resistors Rgg1, and a plurality of resistors Rds1. As described later, an element structure (layout) of the first MOSFET T1 is one of features in the exemplary embodiment.

The plurality of first MOSFETs T1 are connected in series between the high-frequency signal terminal RF1 and the antenna terminal ANT.

The resistor Rgg1 includes one end which is connected to each gate of the plurality of first MOSFETs T1 and the other end to which a control signal Con1 is supplied.

The resistor Rds1 is connected between a drain and a source in each of the plurality of first MOSFETs T1.

The bodies of the first MOSFETs T1 are in a floating state.

The second through-switch TS2 to the n-th through-switch TS[n] have the same configurations. That is, a j-th through-switch TS[j] (where j is an integer 2 to n) includes a plurality of second MOSFETs T2, a plurality of resistors Rgg2, a plurality of resistors Rds2, and a plurality of first diodes D1. The element structure of the second MOSFET T2 is different from the element structure of the first MOSFET T1. The j-th through-switches TS[j] may sometimes be referred to collectively as first through j-th through-switches TS.

The plurality of second MOSFETs T2 are connected in series between the j-th high-frequency signal terminal RF[j] and the antenna terminal ANT.

The resistor Rgg2 includes one end which is connected to the gate of each of the plurality of second MOSFETs T2, and the other end to which the control signal Con[j] is supplied.

The resistor Rds2 is connected between a drain and a source in each of the plurality of second MOSFETs T2.

The first diode D1 is a PN junction diode, and is connected between the body and the gate in each of the plurality of second MOSFETs T2. An anode of the first diode D1 is connected to the body.

Each of the first shunt switch SS1 to the n-th shunt switch SS[n] includes the same configuration as that of the through-switch TS2. That is, the i-th shunt switch includes a plurality of third MOSFETs T3, a plurality of resistors Rgg3, a plurality of resistors Rds3, and a plurality of second diodes D2.

The plurality of third MOSFETs T3 are connected in series between the i-th high-frequency signal terminal RF[i] and the reference potential node.

The resistor Rgg3 includes one end which is connected to each gate of the plurality of third MOSFETs T3 and the other end to which the control signal Con[i]/ is supplied.

The resistor Rds3 is connected between a drain and a source in each of the plurality of third MOSFETs T3.

The second diode D2 is a PN junction diode, and is connected between the body and the gate in each of the plurality of third MOSFETs T3. An anode of the second diode D2 is connected to the body.

For example, the first MOSFETs T1 to the third MOSFETs T3 are N-type MOSFETs, and threshold voltages Vth thereof are substantially 0 V. For example, the high level of the control signal Con1 (corresponding to an on voltage) is 3.5 V, and the low level (corresponding to an off voltage) thereof is −1.5 V. For example, the high level of each of control signals Con2 to Con[n], and Con1/ to Con[n]/ is 3.5 V, and the low level thereof is −3 V. The reason why a value of the low level of the control signal Con1 is different from a value of the low level of other control signals will be described later.

The gate width of each of the first MOSFETs T1 is, for example, 4 mm. In order to achieve a 4 mm gate width size, the first MOSFET T1 is arranged in a multi-finger type pattern as described below.

Figure 2:
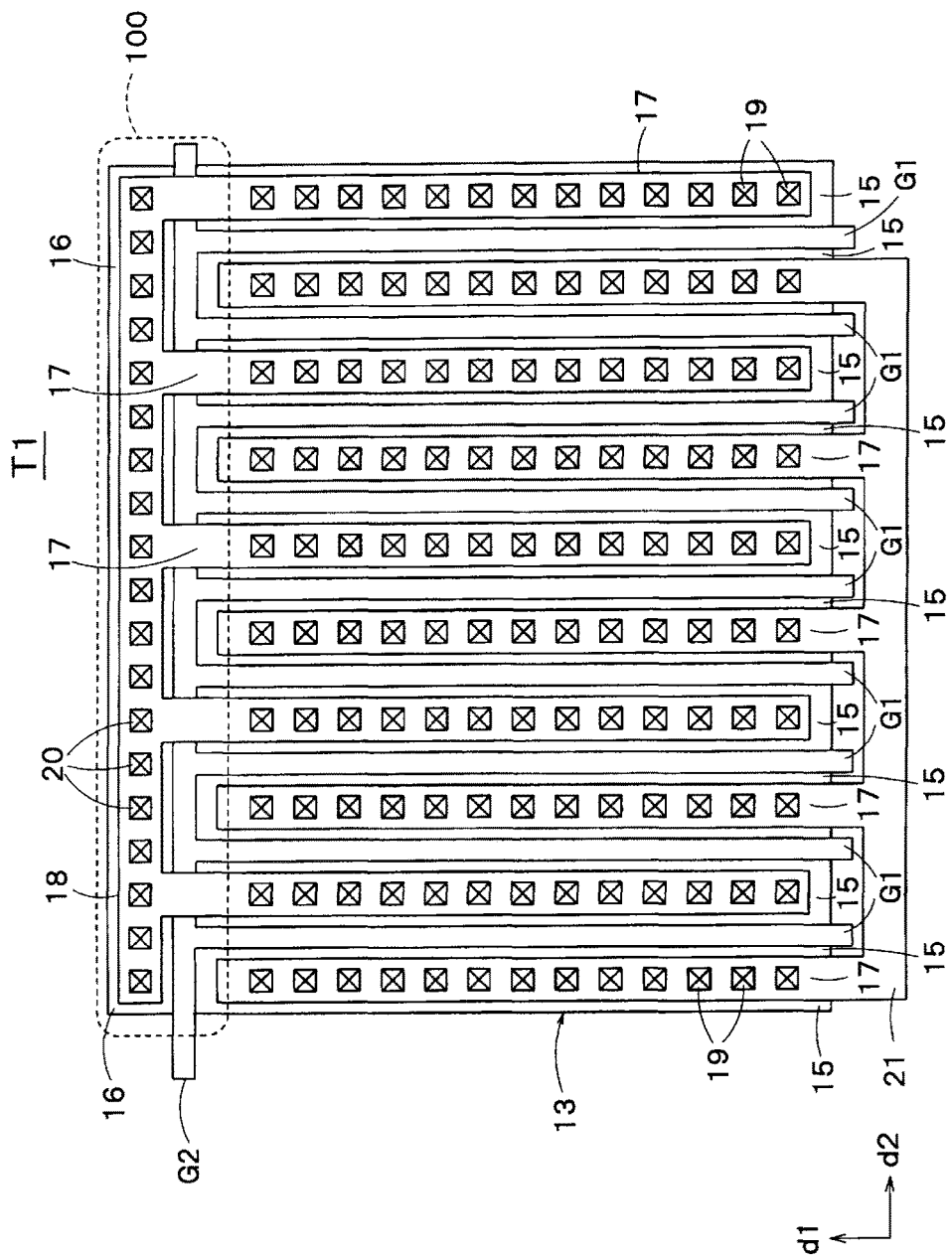
FIG. 2 is a plan view schematically illustrating a layout of a first MOSFET of a first through-switch.
Figure 3:
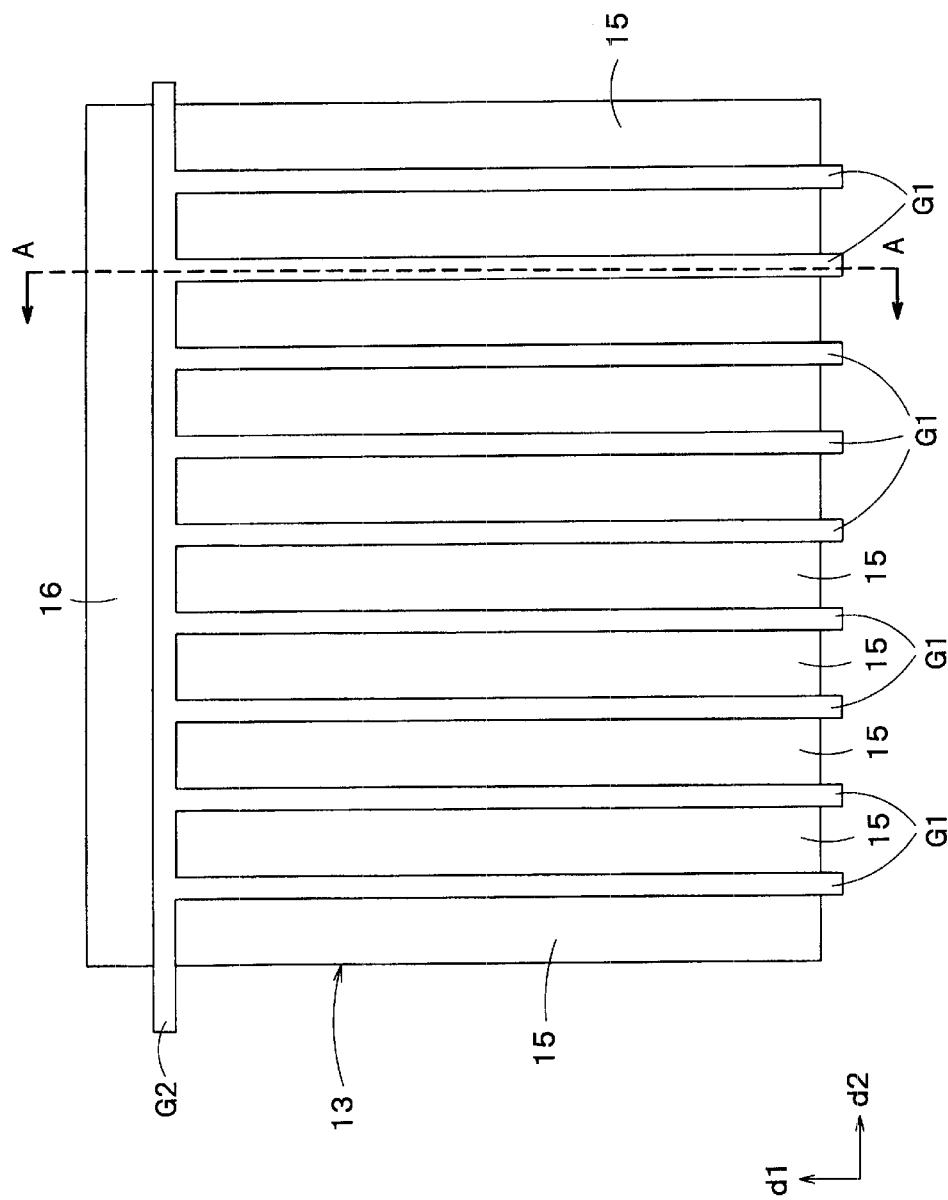
FIG. 3 is a plan view illustrating a semiconductor layer and first and second gate electrodes according to the first embodiment.
Figure 4:
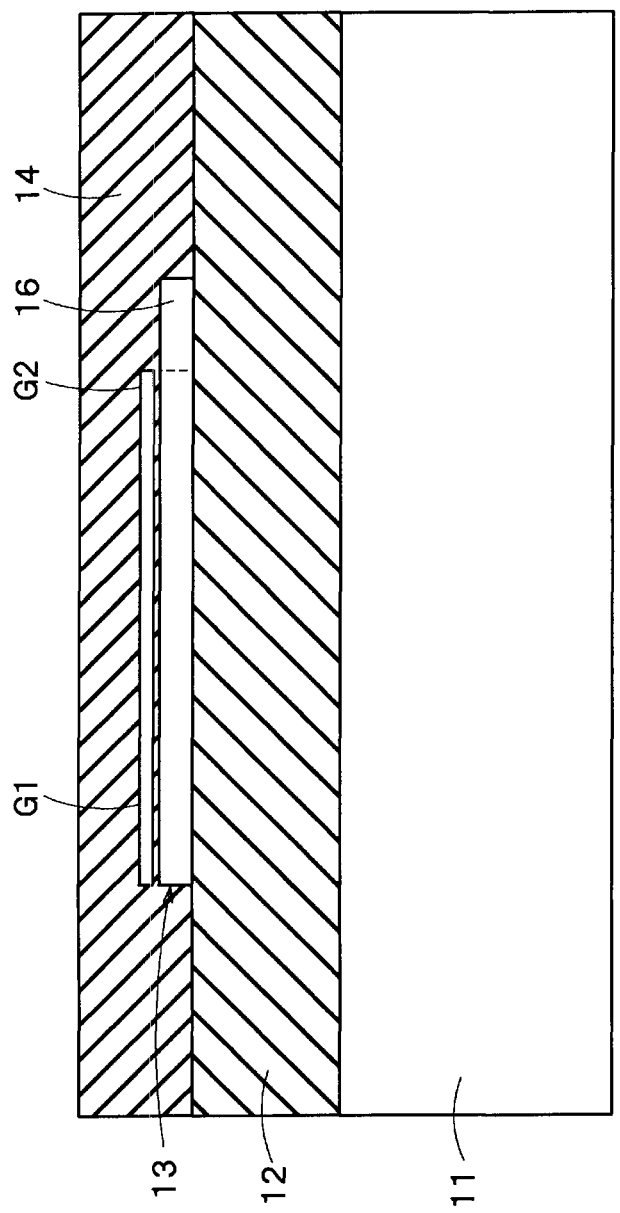
FIG. 4 is a longitudinal sectional view taken along line A-A in FIG. 3.

FIG. 2 is a plan view schematically illustrating a layout of the first MOSFET T1 of the first through-switch TS1. FIG. 3 is a plan view illustrating a semiconductor layer 13 and the first and second gate electrodes G1 and G2 illustrated in FIG. 2. FIG. 4 is a longitudinal sectional view taken along line A-A in FIG. 3.

As illustrated in FIG. 4, the semiconductor switch 1 is provided with a support substrate 11 such as silicon, an insulating layer 12 provided on the support substrate 11, and a semiconductor layer (SDG layer) 13, such as silicon, which is provided on the insulating layer 12. The support substrate 11, the insulating layer 12, and the semiconductor layer 13 comprise the SOI substrate.

Each of the plurality of first MOSFETs T1 includes a plurality of first gate electrodes G1, a second gate electrode G2, a plurality of first diffused regions 15 as a source region or a drain region, a second diffused region 16, a plurality of first wirings 17, a second wiring 18, contacts 19 and 20, and a third wiring 21.

The plurality of first gate electrodes G1 are provided in parallel on the semiconductor layer 13 via an oxide film 14, and extend in a first direction d1. In the example illustrated in the drawing, nine first gate electrodes G1 are indicated in order to clarify the description, but the number of the first gate electrodes G1 is not limited.

The second gate electrode G2 is provided on the semiconductor layer 13 via the oxide film 14, is connected to one end portion of each of the plurality of first gate electrodes G1 in the first direction d1, and extends in a second direction d2. The second direction d2 intersects with the first direction d1. The second gate electrode G2 functions as a gate lead-out portion. The resistor Rgg1 illustrated in FIG. 1 is connected to an end portion of the second gate electrode G2 (not illustrated). The first gate electrode G1 and the second gate electrode G2 are formed of, for example, polysilicon, and are integrally formed.

The semiconductor layer 13 extends in the first direction d1 further than the second gate electrode G2.

The semiconductor layer 13 below the first and second gate electrodes G1 and G2 is the body of the first MOSFET T1, and is P-type.

The first diffused region 15 is N-type, and is provided on the surface of the semiconductor layer 13 between the plurality of first gate electrodes G1.

The second diffused region 16 is provided on the surface of the semiconductor layer 13 positioned on the side opposite to the plurality of first gate electrodes G1 with respect to the second gate electrode G2, and is extended in the second direction d2. The second diffused region 16 is adjacent to the second gate electrode G2 in planar view, and has the same conduction type as that of the first diffused region 15.

In this way, the surface of the semiconductor layer 13 which is not positioned below the first and second gate electrodes G1 and G2 is the N-type first diffused region 15 or the N-type second diffused region 16.

The plurality of first wirings 17 are provided on the plurality of first diffused regions 15 and extend in the first direction d1. Each of the first wirings 17 is electrically connected to the corresponding first diffused region 15 via the contact 19.

The second wiring 18 is, for example, a drain wiring, provided on the second diffused region 16, connected to every other end portion of the plurality of first wirings 17, and extending in the second direction d2. The first wiring 17 and the second wiring 18 are formed of metal or the like, and are integrally formed.

The contact 20 electrically connects the second diffused region 16 and the second wiring 18.

The third wiring 21 is, for example, a source wiring, connected to the plurality of first wirings 17 which are which are not connected to the second wiring 18, and extending in the second direction d2. The first wiring 17 and the third wiring 21 are integrally formed.

Although not illustrated, the semiconductor layers 13 of the plurality of first MOSFETs T1 are individually provided.

In this way, since the semiconductor layer 13 exists below the second gate electrode G2 of the first MOSFET T1, if a predetermined positive voltage is applied to the first and second gate electrodes G1 and G2, an N-type channel is generated on the semiconductor layer 13 positioned below the second gate electrode G2. At this time, the potential of the second diffused region 16 becomes substantially the same as that of the first diffused region 15. That is, a region 100 in which the second gate electrode G2 is provided becomes an intrinsic FET. Accordingly, a ground capacitance Cgg does not exist between the second gate electrode G2 and the reference potential which is a potential applied to the rear surface of the support substrate 11.

Therefore, it is likely that a second harmonic distortion HD2 which is generated when the through-switch TS1 is in a conduction state is reduced as the resistance of resistor Rgg1 becomes greater. The reason will be described below compared to a semiconductor switch 1X in Comparative Example.

Figure 5:
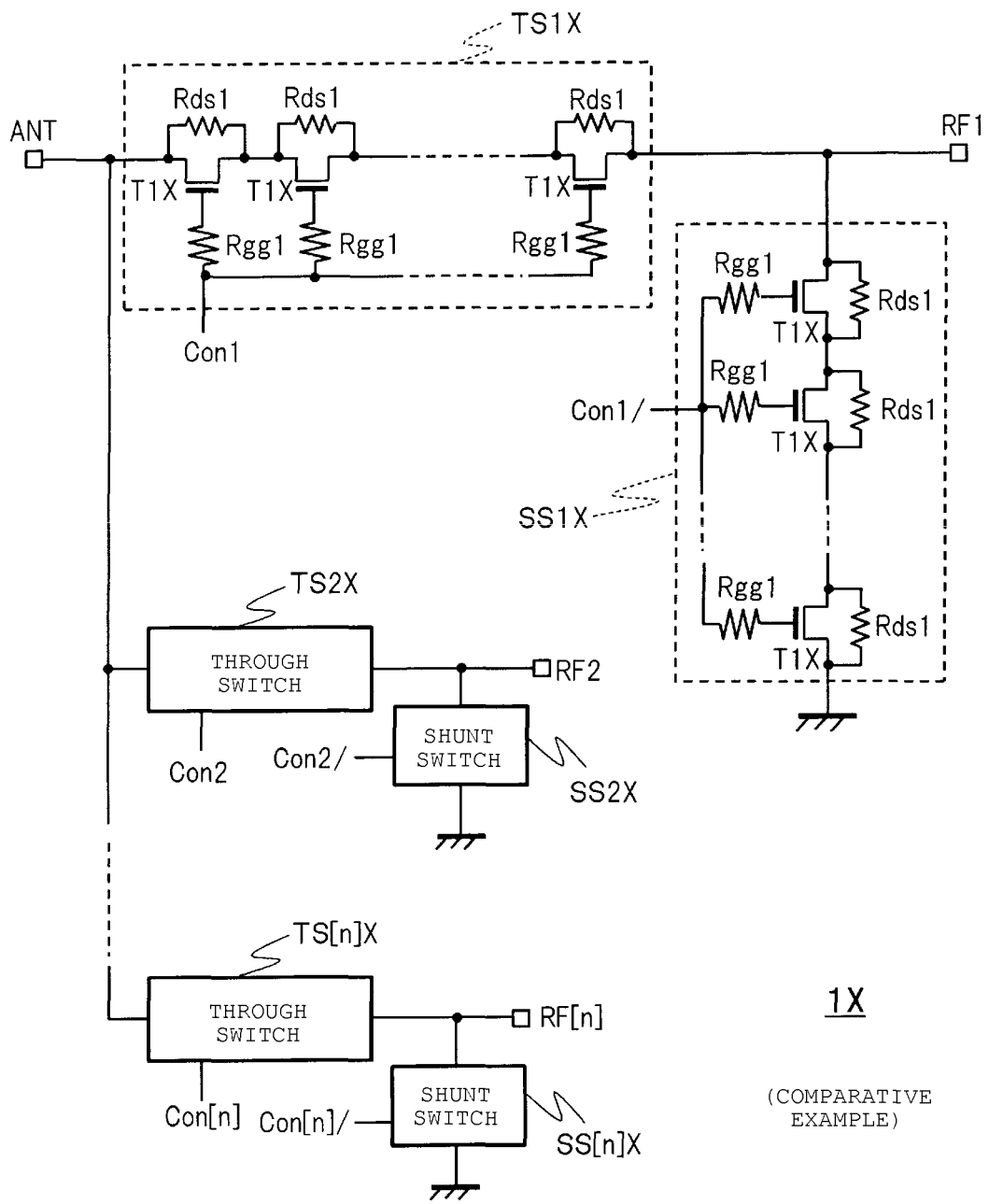
FIG. 5 is a circuit diagram of a semiconductor switch in a Comparative Example.

FIG. 5 is a circuit diagram illustrating the semiconductor switch 1X in a Comparative Example. As illustrated in FIG. 5, a through-switch TS1X has the same configuration as that of the through-switch TS1 illustrated in FIG. 1, except for an element structure of a MOSFET T1X. Through-switches TS2X to TS[n]X and shunt switches SS1X to SS[n]X have the same configuration as that of the through-switch TS1X.

Figure 6:
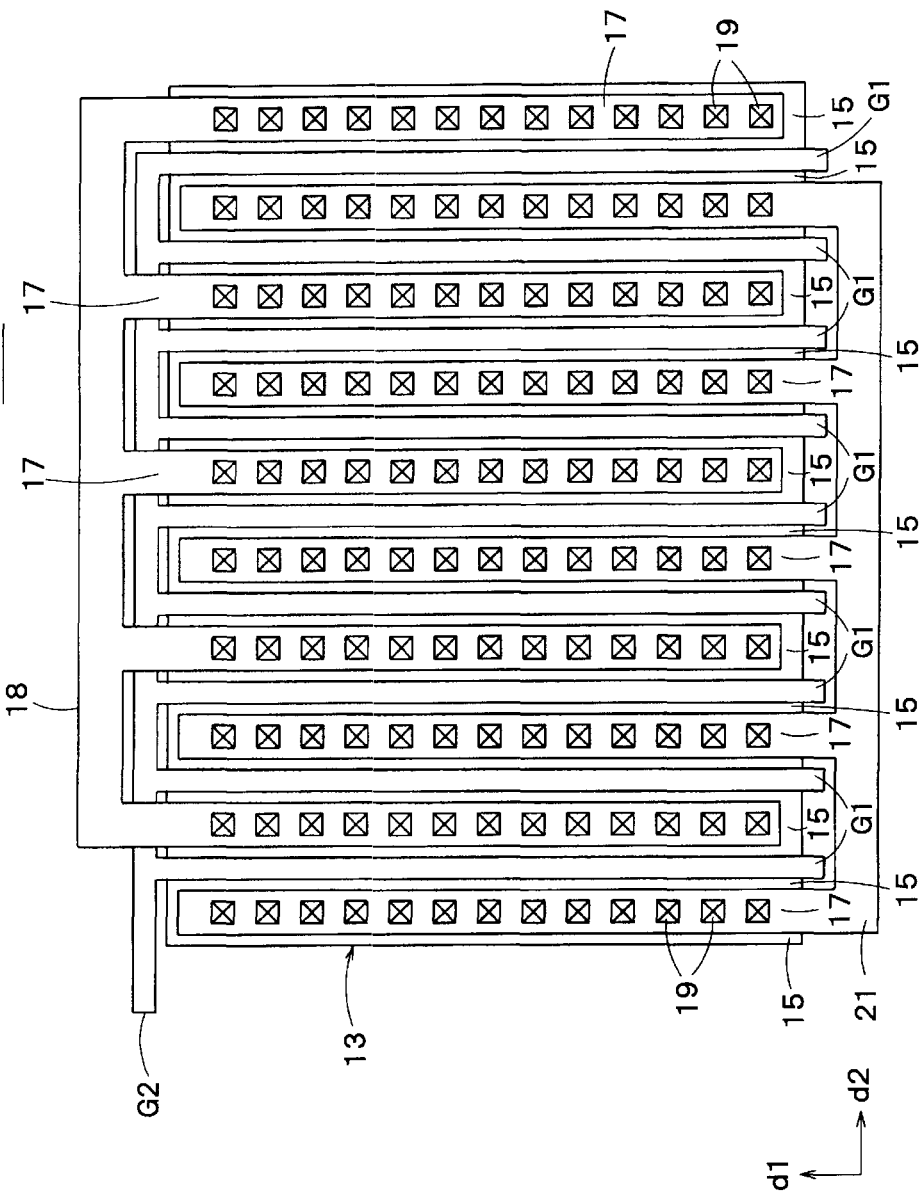
FIG. 6 is a plan view schematically illustrating a layout of the MOSFET of the Comparative Example.
Figure 7:
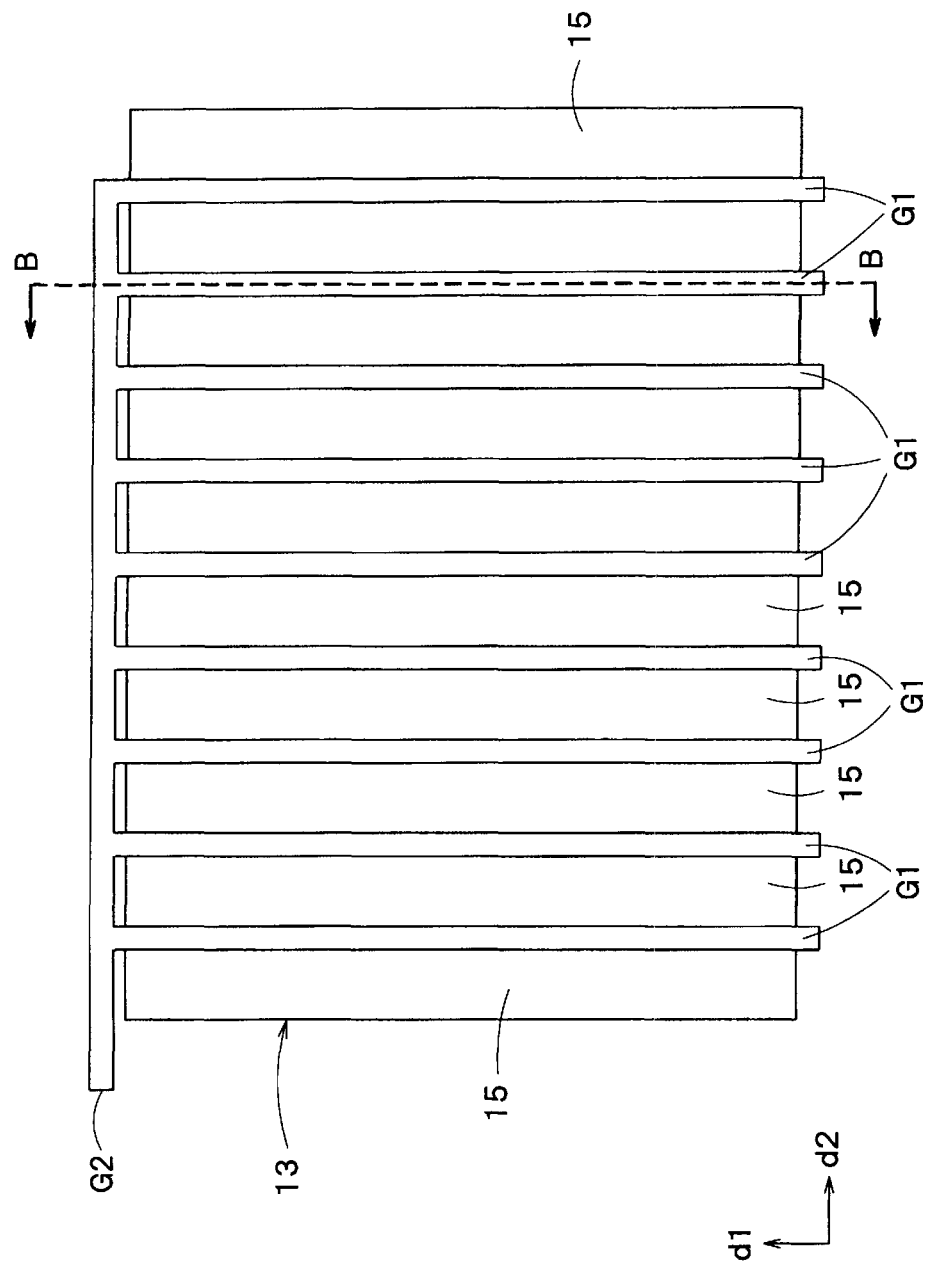
FIG. 7 is a plan view illustrating a semiconductor layer and first and second gate electrodes of the Comparative Example.
Figure 8:
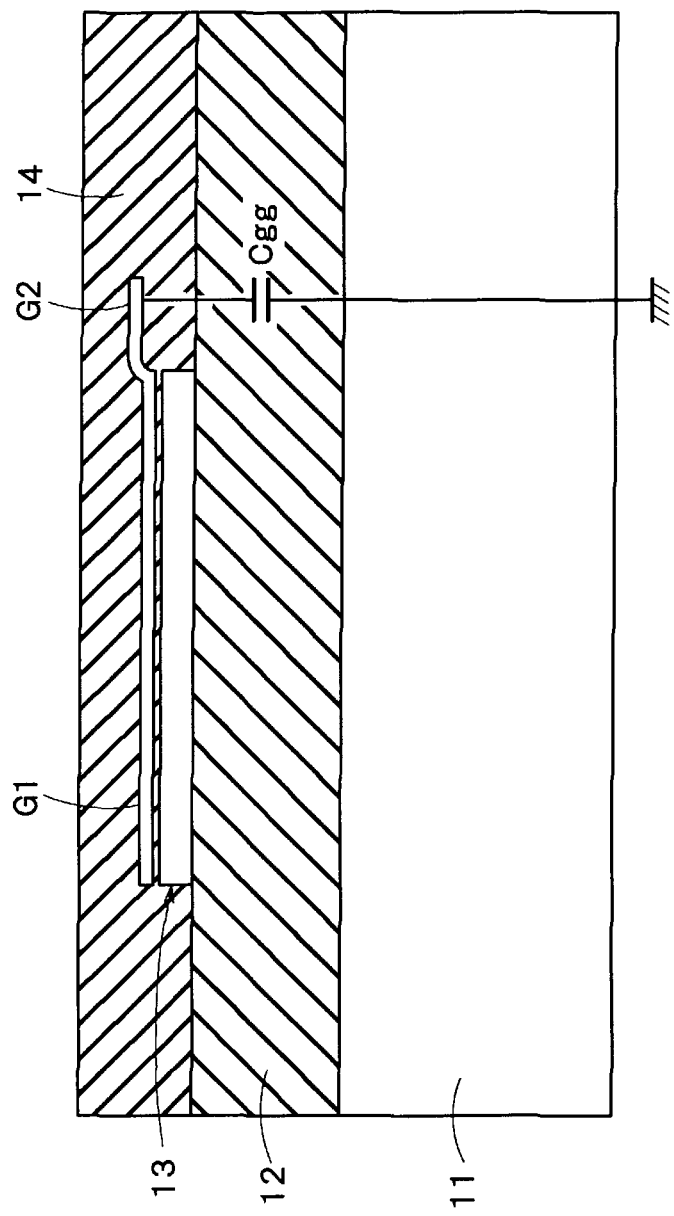
FIG. 8 is a longitudinal sectional view taken along line B-B in FIG. 7.

FIG. 6 is a plan view schematically illustrating a layout of the MOSFET T1X illustrated in FIG. 5. FIG. 7 is a plan view illustrating the semiconductor layer 13 and the first and second gate electrodes G1 and G2 illustrated in FIG. 6. FIG. 8 is a longitudinal sectional view taken along line B-B in FIG. 7.

As illustrated in FIG. 6 to FIG. 8, and unlike the first embodiment, the second gate electrode G2, which functions as the gate lead-out portion, is provided on the outside of the semiconductor layer 13 and does not overlap the semiconductor layer 13. Accordingly, unlike the first embodiment, the ground capacitance Cgg exists between the second gate electrode G2 and a reference potential, which is the potential applied to the rear surface of the support substrate 11. The ground capacitance Cgg has a bad influence on the second harmonic distortion HD2 as described below.

Figure 9:
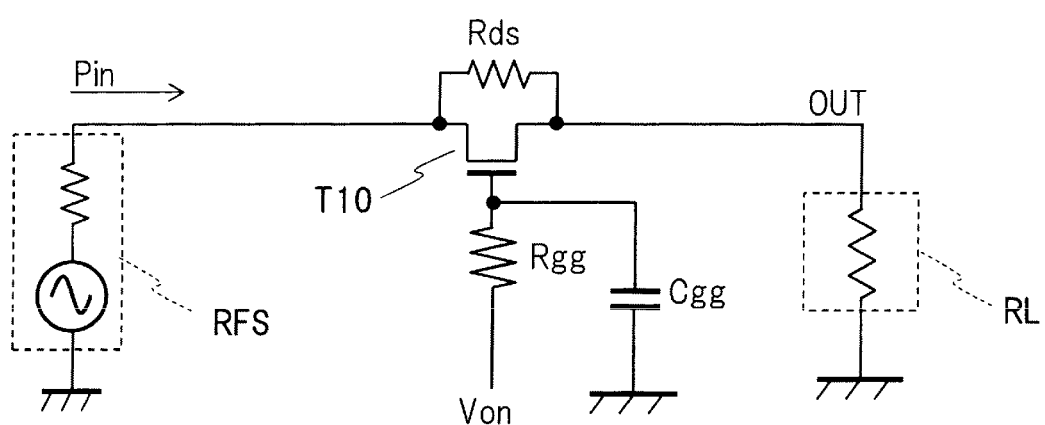
FIG. 9 is a circuit diagram illustrating a simulation circuit for investigating a second harmonic distortion occurring in the MOSFET of the through-switch while in an on state.

FIG. 9 is a circuit diagram of a simulation circuit established so as to investigate the second harmonic distortion HD2 generated in the MOSFET T10 of the through-switch in an on state.

The on voltage $V_{on}$ (=3.5V) is applied to the gate of the MOSFET T10 via the resistor Rgg. In addition, the ground capacitance Cgg is added to the gate.

The resistor Rds is connected between the source and the drain of the MOSFET T10. A high frequency signal of a power $P_{in}$ is supplied to the source of the MOSFET T10 from a signal source RFS. A load RL is connected to the drain of the MOSFET T10. By using this circuit, the second harmonic distortion HD2 is simulated in an output signal OUT of the drain of the MOSFET T10.

Figure 10:
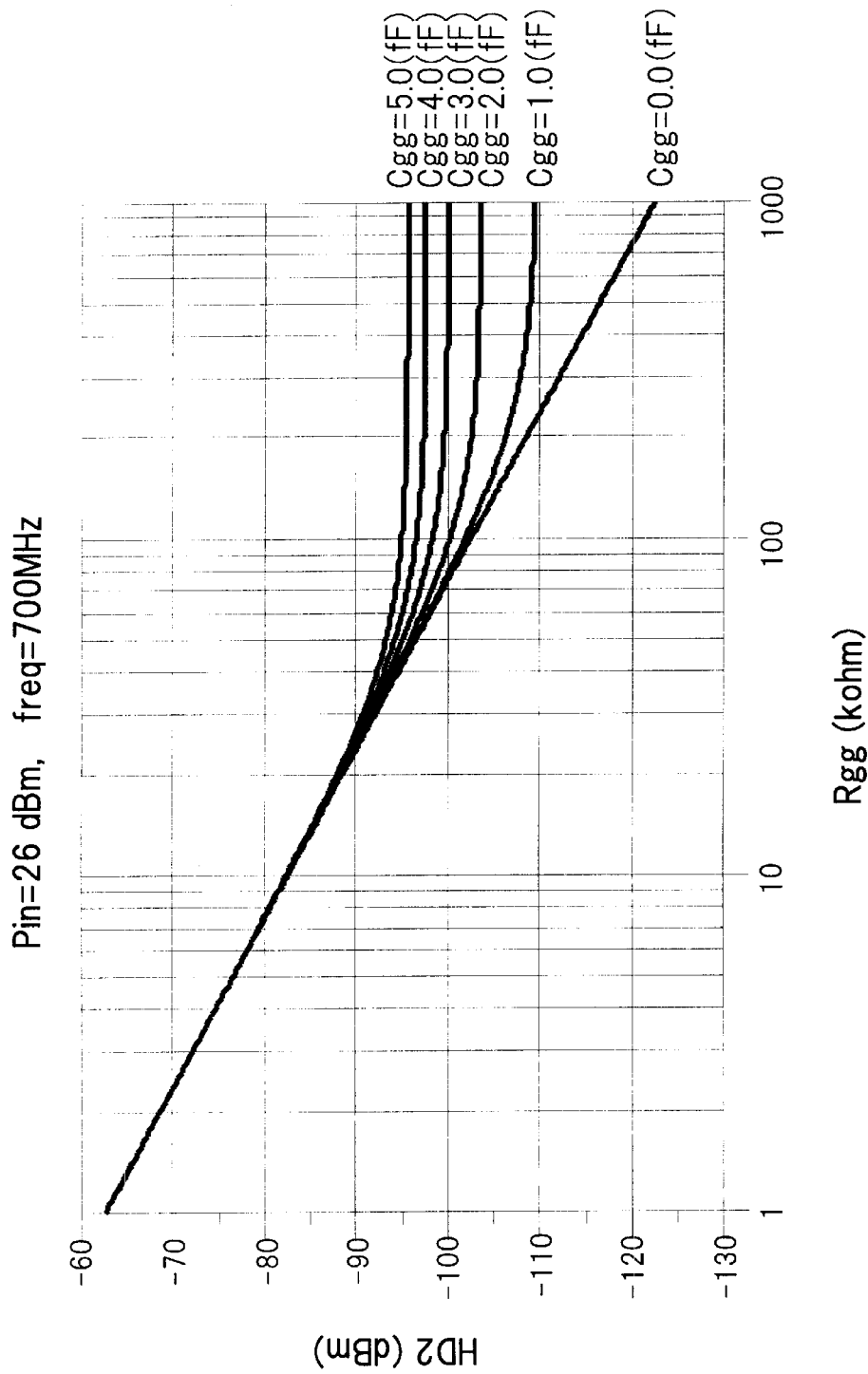
FIG. 10 is a simulation result of the second harmonic distortion in a circuit illustrated in FIG. 9.

FIG. 10 is a simulation result of the second harmonic distortion HD2 obtained by the circuit illustrated in FIG. 9. FIG. 10 illustrates the relationship between the second harmonic distortion HD2 and the resistor Rgg with respect to each ground capacitance Cgg.

Main element parameters of the MOSFET T10 used for the simulation are as follows.

Gate oxide film thickness=9 nm
Gate length=0.25 μm
Gate width=4 mm
Threshold Vth=0 V In addition, the power $P_{in}$ of the high frequency signal is 26 dBm, a frequency fin of the high frequency signal is 700 MHz, and an impedance of the signal source RFS and the load RL is 50Ω.

From the result illustrated in FIG. 10, when the ground capacitance Cgg is 0 fF (femtofarads), the second harmonic distortion HD2 is indicated by HD2 (dBm)=constant−20 log (Rgg).

Accordingly, when the ground capacitance Cgg is 0 fF, it is likely that the second harmonic distortion HD2 is improved as the resistor Rgg becomes greater in value.

However, in Comparative Example, as illustrated in FIG. 10, the second harmonic distortion HD2 is not improved beyond a certain value even when the resistor Rgg becomes greater since there is a finite ground capacitance Cgg as described above. For example, when the ground capacitance Cgg is 5 fF, the second harmonic distortion HD2 is saturated at about −95.6 dBm. The actual ground capacitance Cgg in the configuration of Comparative Example is, for example, about 5 fF.

FIG. 10 illustrates a simulation result by using one MOSFET T10, but in the actual through-switch, 16 stages of the MOSFETs are connected in series, for example.

When the number of the serial connection stages is set as N, the second harmonic distortion HD2 is expressed as the following:

$$HD2\ (dBm) = constant + 20\ \log(N).$$

Accordingly, in a case of N=16, and Cgg=5 fF, an HD2=−95.6+24.1=−71.5 dBm. This value is not the −84 dBm level which is required for a mobile terminal which is equipped with a GPS function.

In this way, in Comparative Example, it is difficult to improve the second harmonic distortion HD2 in such a manner that the ground capacitance Cgg exists in the gate of the MOSFET T1X.

In contrast, in the exemplary embodiment, since the ground capacitance Cgg is substantially 0, the second harmonic distortion HD2 is improved as the resistor Rgg value becomes greater, as apparent from the simulation result in FIG. 10.

In addition, as described above, in the through-switches TS2 to TS[n] except for the through-switch TS1 and the shunt switches SS1 to SS[n], the first diode D1 or the second diode D2 is connected between the body and the gate in each of the second and third MOSFETs T2 and T3.

Owing to this, when the through-switch TS1 is in the on state, it is possible to make the harmonic distortion (hereinafter, referred to as off distortion), which is generated in the through-switches TS2 to TS[n] and the shunt switches SS1 to SS[n] which are in the off state, small enough to be ignored, and the reason thereof will be described below.

The off distortion is generated by an accumulated charge (hole) existing in the body of the MOSFET in the off state. A PN junction is formed between a P-type body and an N-type source, and a PN junction is formed between the P-type body and an N-type drain in the MOSFET in the off state. That is, two parasitic diodes are reversely connected in series between the source and the drain. Theses diodes are non-linear elements, and thus become a distortion source.

However, in the configuration illustrated in FIG. 1 in the exemplary embodiment, when a negative off voltage is applied to the gate of the second MOSFET T2 or the third MOSFET T3, the accumulated charge in the body is removed through the first diode D1 or the second diode D2, and thus the parasitic diodes almost completely disappear. Therefore, it is preferable that this distortion source does not exist in the off state.

Accordingly, in the exemplary embodiment, the second harmonic distortion HD2 of the through-switch TS1 may be continuously reduced by causing the resistor Rgg1 to be greater, and the off distortion in other through-switches TS2 to TS[n] and the shunt switches SS1 to SS[n] negligibly small. For this reason, it is possible to further improve the second harmonic distortion HD2 when the through-switch TS1 is in the conduction state. Accordingly, for example, since the second harmonic distortion HD2 when the through-switch TS1 is in the conduction state has little to no influence on the GPS signal, it is possible to use the semiconductor switch 1 in a mobile terminal which is equipped with a GPS function.

Meanwhile, it is not possible to improve the second harmonic distortion HD2 in the on state in the configuration of the through-switches TS2 to TS[n] and the shunt switches SS1 to SS[n].

Incidentally, the maximum allowable voltage amplitude per stage of the second and third MOSFETs T2 and T3 in the off state is improved in the through-switches TS2 to TS[n] and the shunt switches SS1 to SS[n] to which the first diode D1 or the second diode D2 is connected. For this reason, it is possible to make the number of the connection stage of the second and third MOSFETs T2 and T3 smaller than that of the through-switch TS1. Accordingly, it is possible to reduce the size of the semiconductor switch 1.

Further, when the off voltage of the control signal except for the control signal Con1 is set to be lower than the off voltage of the control signal Con1 (that is, these off voltages become a larger magnitude value on the negative side), it is possible to reduce the number of the connection stage since the maximum allowable voltage amplitude per stage of the second and third MOSFETs T2 and T3 in the off state is improved. Accordingly, it is possible to reduce the size of the semiconductor switch 1.

That is, in a case where the number of the connection stage of the first MOSFET T1 in the through-switch TS1 is set as N1, the off voltage of the control signal Con1 is set as Voff1, the number of the connection stage of each of the second and third MOSFETs T2 and T3 in the through-switches TS2 to TS[n] and the shunt switches SS1 to SS[n] is set as N2, and the off voltage of the control signal except for the control signal Con1 is set as Voff2, it is preferable for N1>N2, or N1>N2 and Voff1>Voff2. For example, it is preferable for N1=16, N2=8, Voff1=−1.5 V, and Voff2=−3 V.

In other words, the number N1 of the plurality of first MOSFETs T1 in the through-switch TS1 may be more than the number N2 of the plurality of second MOSFETs T2 in the through-switch TS[j], and may be more than the number N2 of the plurality of third MOSFETs T3 in the shunt switch SS[i].

In addition, the gate voltage Voff1 when the plurality of first MOSFETs T1 are in a non-conduction state may be greater than the gate voltage Voff2 when the plurality of second MOSFETs T2 are in a non-conduction state, and may be greater than the gate voltage Voff2 when the plurality of third MOSFETs T3 are in a non-conduction state.

As described above, according to the exemplary embodiment, since the semiconductor layer 13 is provided below the second gate electrode G2, it is possible to reduce the ground capacitance Cgg of the second gate electrode G2. Accordingly, it is possible to improve the second harmonic distortion HD2 when the through-switch TS1 is in a conduction state. In other words, it is possible to improve high frequency characteristics.

Note that, the contact 20 of the second wiring 18 is not necessarily provided. In addition, the shunt switches SS1 to SS[n] are not necessarily required. Even with this altered configuration, the same beneficial effects as that described above may be obtained.

In addition, at least one of the through-switches TS2 to TS[n] may be the same configuration as that of the through-switch TS1. With such a configuration, it is possible to improve the second harmonic distortion HD2 in a plurality of high-frequency signal paths.

Second Embodiment

The second embodiment is related to a semiconductor switch 1A which may improve the maximum allowable input power.

It is effective to increase the number of the connection stages of the MOSFET T1X so as to improve the maximum allowable input power in the semiconductor switch 1X in Comparative Example described above, but a region of the semiconductor switch 1X is consequently enlarged. In this regard, in the second embodiment, it is possible to improve the maximum allowable input power while suppressing the increase in the region of the semiconductor switch 1A.

Figure 11:
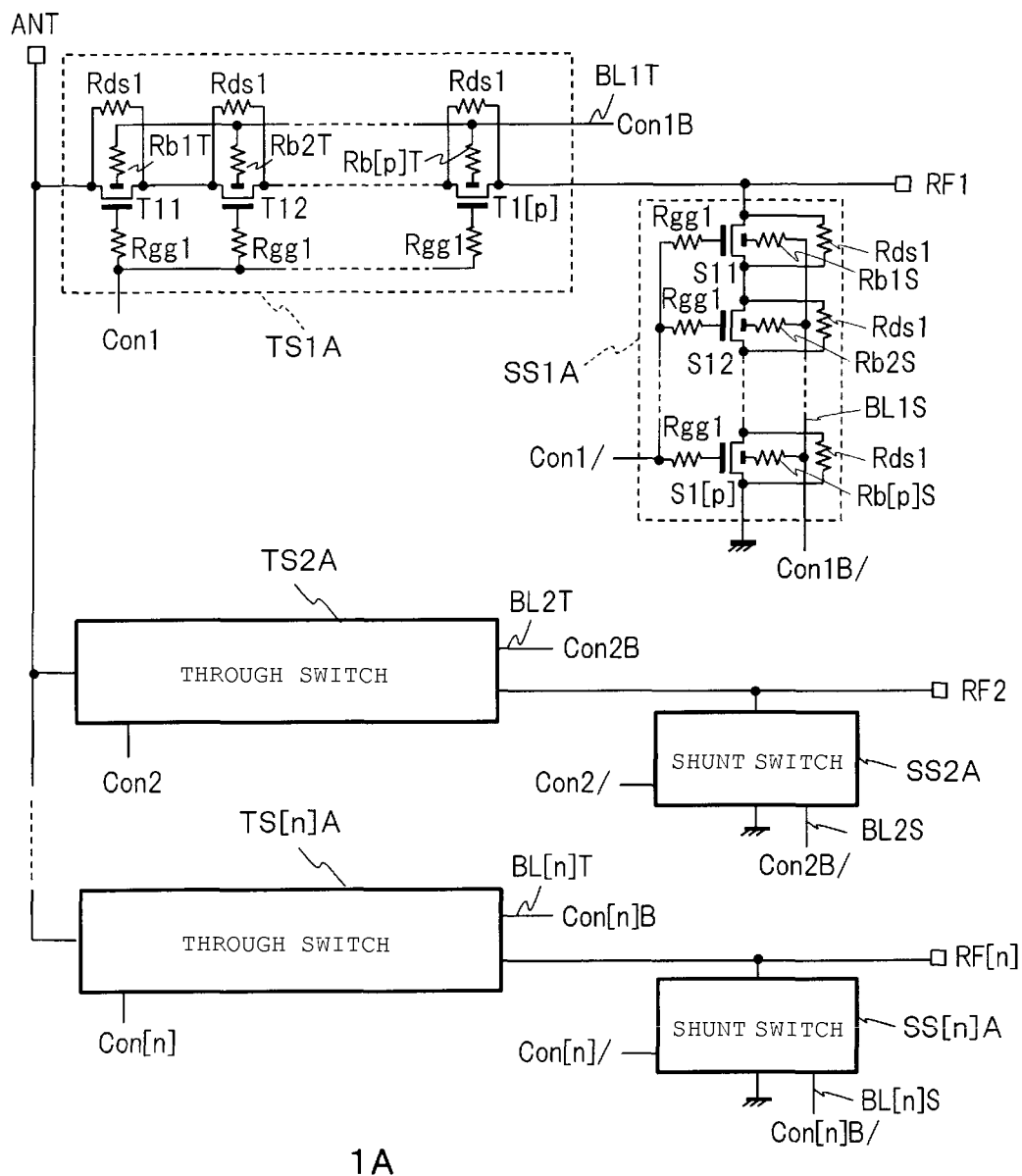
FIG. 11 is a circuit diagram illustrating a semiconductor switch according to a second embodiment.

FIG. 11 is a circuit diagram illustrating the semiconductor switch 1A according to the second embodiment. In FIG. 11, components commonly illustrated in FIG. 1 are denoted by the same reference numerals, and differences therefrom will be mainly described in the following.

As illustrated in FIG. 11, the semiconductor switch 1A is provided with a first through-switch TS1A to an n-th through-switch TS[n]A (the first switches), and a first shunt switch SS1A to an n-th shunt switch SS[n]A (the second switches).

The through-switch TS1A includes a first first MOSFET T11 to a p-th first MOSFET T1[p] (where p is an integer of 4 or more), and a first first resistor Rb1T to a p-th first resistor Rb[p]T, a plurality of resistors Rgg1, and a plurality of resistors Rds1.

The first MOSFETs T11 to T1[p] are connected in series between the antenna terminal ANT and the high-frequency signal terminal RF1. The first first MOSFET T11 to the p-th first MOSFET T1[p] are connected in order from the antenna terminal ANT. Each of the first MOSFETs T11 to T1[p] has substantially the same characteristics.

An x-th first resistor Rb[x]T (where x is an integer 1 to p) is connected between the body of the x-th first MOSFET T1[x] and the first first body control line BL1T. A body control signal Con1B is supplied to the first body control line BL1T.

When the resistance value of the x-th first resistor Rb[x]T is set as Rb[x]T, and k is set as an integer equal to or greater than 3 and less than p, the relationship expressed by Rb1T>Rb2T> . . . >Rb[k]T≥Rb[k+1]T≥ . . . ≥Rb[p]T is satisfied.

In other words, a resistance value Rb1T of a first resistor Rb1T is greater than the resistance value Rb[p]T of the first resistor Rb[p]T.

Each configuration of the through-switch TS2A to TS[n]A is the same as the configuration of the through-switch TS1A.

The shunt switch SS1A includes a first second MOSFET S11 to a p-th second MOSFETs S1[p], a first second resistor Rb1S to a p-th second resistor Rb[p]S, the plurality of resistors Rgg1, and the plurality of resistors Rds1.

The second MOSFETs S11 to S1[p] are connected in series between the high-frequency signal terminal RF1 and the reference potential node. The first second MOSFET S11 to the p-th second MOSFET S1[p] are connected in order from the high-frequency signal terminal RF1. Each of the second MOSFETs S11 to S1[p] has substantially the same characteristics.

The x-th second resistor Rb[x]S is connected between the body of the x-th second MOSFET S1[x] and a first second body control line BL1S. A body control signal Con1B/ is supplied to the second body control line BL1S.

When the resistance value of the x-th second resistor Rb[x]S is set as Rb[x]S, the relationship expressed by Rb1S>Rb2S> . . . >Rb[k]S≥Rb[k+1]S≥ . . . ≥Rb[p]S is satisfied.

In other words, the resistance value Rb1S of the second resistor Rb1S is greater than the resistance value Rb[p]S of the second resistor Rb[p]S.

Each configuration of the shunt switch SS2A to SS[n]A is the same as the configuration of the shunt switch SS1A.

Owing to such a configuration, the maximum allowable input power of the semiconductor switch 1A may be increased. The reason will be described below.

A body control signal Con[x]B of the reference potential, for example, is supplied to a first body control line BL[x]T of the through-switch TS[x]A which is in the on state. A body control signal Con[x]B/ of the reference potential, for example, is supplied to the second body control line BL[x]S of the shunt switch SS[x]A which is in the on state. The body control signal Con[x]B of a negative potential is supplied to the first body control line BL[x]T of the through-switch TS[x]A which is in the off state. The body control signal Con[x]B/ of the negative potential is supplied to a second body control line BL[x]S of the shunt switch SS[x]A which is in the off state.

That is, one of features in the second embodiment is that the negative potential is supplied to the body in each of the first MOSFETs T11 to T1[p] in the off state, and the second MOSFETs S11 to S1[p] in the off state. Hereinafter, this type is referred to as a body potential control type. In the body potential control type, when the body control signals Con1B to Con[n]B, and Con1B/ to Con[n]B/ are the negative potentials, the accumulated charge (hole) of the body is removed, a withstand voltage between the drain and the source are improved. When the accumulated charge is removed from the body, the withstand voltage between the drain and the source is apparently improved.

However, unlike the exemplary embodiment, when it is assumed that the resistance value of each of the first resistors Rb1T to Rb[p]T and the second resistors Rb1S to Rb[p]S is the same, there is a problem in the body potential control type as well.

For example, in the GSM, the maximum value of the input power is about 35 dBm. When the impedance of the antenna is ideally 50Ω, the voltage amplitude at this time is about 17.78 V.

If the impedance of the antenna is deviated from 50Ω in some cases, then the maximum value of the reflection coefficient is generally estimated to be 0.6. Due to this, voltage amplitude or current amplitude becomes 1.6 times at the maximum.

Therefore, the through-switch and the shunt switch in the off state are required to withstand up to 17.78 V×1.6≈28.4 V.

The first MOSFETs T11 to T1[p] are connected in multiple stages and the second MOSFETs S11 to S1[p] are connected in multiple stages since the MOSFET is maintained to be in the off state even when the large voltage amplitude is applied.

When it is assumed that the number of the connection stage is set as eight, and the voltages are evenly applied to the first MOSFETs and the second MOSFETs per stage, 28.4/8=3.55 V is satisfied. Accordingly, when a drain breakdown voltage of each of the first MOSFETs T11 to T1[p] and the second MOSFETs S11 to S1[p] is set as 3.55 V or higher, the first MOSFETs T11 to T1[p] and the second MOSFETs S11 to S1[p] are normally operated.

However, not all of the multi-connected first MOSFETs T11 to T1[p] and the multi-connected second MOSFETs S11 to S1[p] perform the same operation. When the gate or the body is completely in the floating state in alternating current (AC), each of the first MOSFETs T11 to T1[p] and the second MOSFETs S11 to S1[p] performs the same operation in principle. However, the gate and the body are actually connected to a certain potential by a finite resistance, and thus each of the first MOSFETs T11 to T1[p] and the second MOSFETs S11 to S1[p] does not perform the exact same operation.

Here, the body potential of each of the first MOSFETs T11 to T1[p] is considered when the through-switch TS1A is in the off state. At this time, since the shunt switch SS1A is in the on state, the high-frequency signal terminal RF1 is substantially grounded.

When the number of the connection stage p is set as 8, and the voltage amplitude of the antenna terminal ANT is set as 28.4 V, the voltage amplitude of the drain in the eighth first MOSFET T18 becomes 3.55 V.

Therefore, the voltage between the drain of the eighth first MOSFET T18 when a high frequency signal of a sine wave approaches a positive peak value and the first body control line BL1T becomes 3.55V−(−3 V)=6.55 V when the body control signal Con1B is set as −3 V.

On the other hand, since 28.4 V is applied to the drain in the first first MOSFET T11, the voltage between the drain of the first first MOSFET T11 and the first body control line BL1T becomes 28.4 V−(−3 V)=31.4 V.

In consideration of the above description, the closer the first MOSFET to the antenna terminal ANT is, the larger a voltage between the drain and the body is. For this reason, when it is assumed that the resistance value of each of the first resistors Rb1T to Rb[p]T is the same, the closer the first MOSFET to the antenna terminal ANT is, the more strongly the accumulated charge is removed from the body in the first MOSFET. It may be considered convenient, when the voltage between the drain and the body exceeds a certain limit, the break down may occur between the drain and the body. As a result, the maximum allowable input power is decreased. If all of the first resistors Rb1T to Rb[p]T are made large, the break down may be suppressed, but the region of the semiconductor switch 1A is consequently enlarged.

The same is applicable for the second MOSFETs S11 to S1[p] when the through-switch TS1A is in the on state, and the shunt switch SS1A is in the off state. In this case, the closer the second MOSFET to the high-frequency signal terminal RF1 is, the larger a voltage between the drain and the body is.

According to the exemplary embodiment, the closer the first MOSFET to the antenna terminal ANT is, the larger a resistance value of each of the first resistors Rb1T to Rb[p]T which are connected to the body of the first MOSFET is. Then, the voltage between the drain and the body in each of the first MOSFETs T11 to T1[p] may be substantially evenly applied. For this reason, it is possible to evenly remove the accumulated charge from the body in each of the first MOSFETs T11 to T1[p].

Similarly, the closer the second MOSFET to the high-frequency signal terminals RF1 to RF[n] is, the larger a resistance value of each of the second resistors Rb1S to Rb[p]S which are connected to the body of the second MOSFET is. Then, the voltage between the drain and the body in each of the second MOSFETs S11 to S1[p] may be substantially evenly applied. For this reason, it is possible to evenly remove the accumulated charge from the body in each of the second MOSFETs S11 to S1[p].

Therefore, the break down may be prevented from occurring between the drain and the body in each of the first MOSFETs T11 to T1[p] and the second MOSFETs S11 to S1[p], it is possible to improve the maximum allowable input power.

In addition, since all of the resistance values of the first resistors Rb1T to Rb[p]T and the resistance values of the second resistors Rb1S to Rb[p]S are not necessarily large, it is possible to prevent the region of the semiconductor switch 1A from being enlarged.

Note that, some of the resistance values of the first resistors Rb1T to Rb[p]T may be the same as long as the resistance values satisfy the relationship described above. For example, when k=3, Rb1T>Rb2T>Rb3T=Rb4T= . . . =Rb[p]T is satisfied. In this case, the circuit is more easily designed as compared to when all of the resistance values of the first resistors Rb1T to Rb[p]T are set to be different from each other. The same is applicable for the second resistors Rb1S to Rb[p]S.

Third Embodiment

Unlike the second embodiment, the third embodiment has a circuit configuration for supplying a negative potential to the body of the MOSFET.

Figure 12:
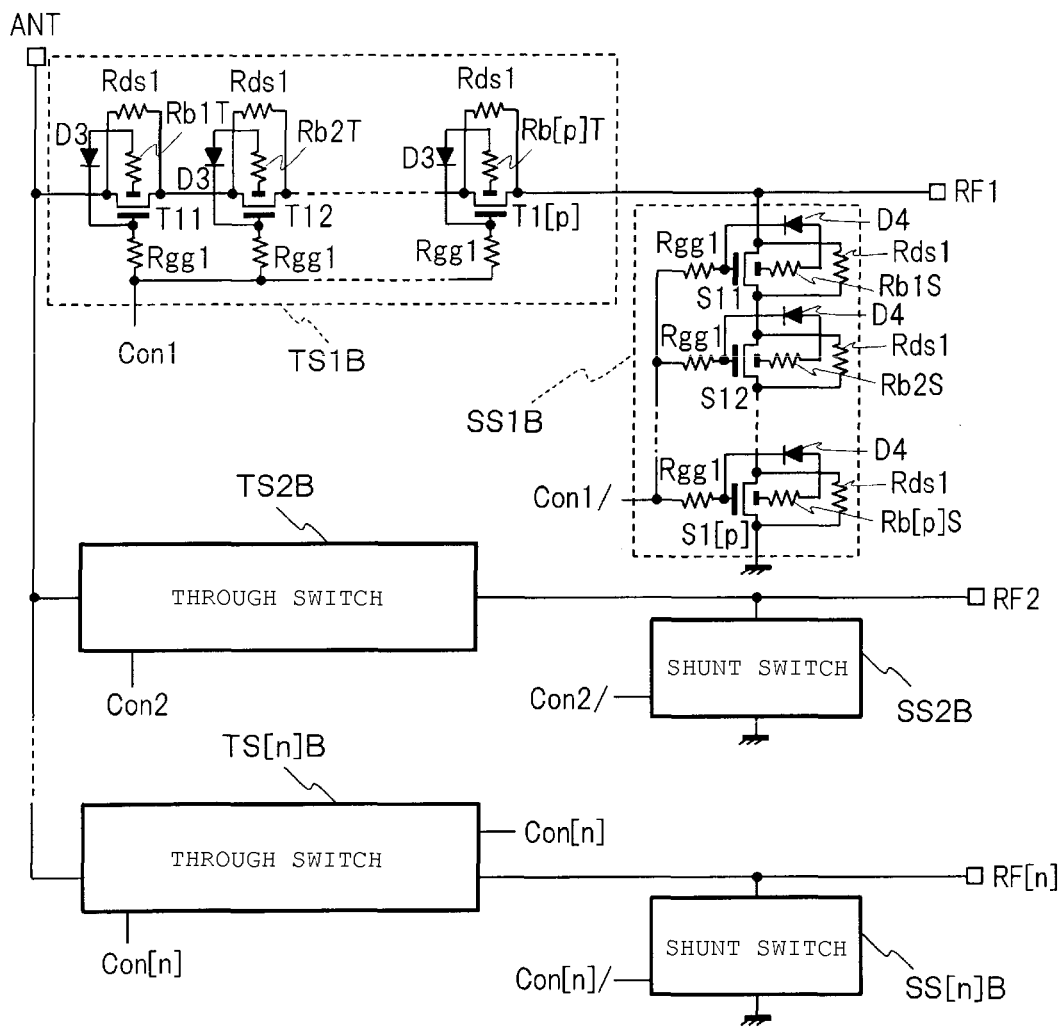
FIG. 12 is a circuit diagram illustrating a semiconductor switch according to a third embodiment.

FIG. 12 is a circuit diagram of a semiconductor switch 1B according to the third embodiment. In FIG. 12, components commonly illustrated in FIG. 11 are denoted by the same reference numerals, and differences therefrom will be mainly described in the following.

As illustrated in FIG. 12, the semiconductor switch 1B is provided with a first through-switch TS1B to an n-th through-switch TS[n]B (the first switches), and a first shunt switch SS1B to an n-th shunt switch SS[n]B (the second switches).

The through-switch TS1B includes a first first diode D3 to a p-th first diode D3 in addition to the configuration of the through-switch TS1A as illustrated in FIG. 11. Each of the first diodes D3 has substantially the same characteristics.

An x-th first diode D3 and the x-th first resistor Rb[x]T are connected in series between the body and the gate in the x-th first MOSFET T1[x]. The x-th first resistor Rb[x]T is connected to the body in the x-th first MOSFET T1[x]. An anode of the x-th first diode D3 is positioned at the body of the x-th first MOSFET T1[x].

The resistance values Rb1T to Rb[p]T of the first resistors Rb1T to Rb[p]T are set to be the same as those in the second embodiment.

The each configuration of through-switches TS2B to TS[n]B is the same as the configuration of the through-switch TS1B.

The shunt switch SS1B includes a first second diode D4 to a p-th second diode D4 in addition to the configuration of the shunt switch SS1A as illustrated in FIG. 11. Each of the second diodes D4 has substantially the same characteristics.

An x-th second diode D4 and the x-th second resistor Rb[x]S are connected in series between the body and the gate in the x-th second MOSFET S1[x]. The x-th second resistor Rb[x]S is connected to the body in the x-th second MOSFET S1[x]. An anode of the x-th second diode D4 is positioned at the body of the x-th second MOSFET S1[x].

The resistance values Rb1S to Rb[p]S of the second resistors Rb1S to Rb[p]S are set to be the same as those in the second embodiment.

The each configuration of the shunt switches SS2B to SS[n]B is the same as the configuration of the shunt switch SS1B.

The control signal Con[x] of the positive potential is supplied to the through-switch TS[x]B which is in the on state. The control signal Con[x]/ of the positive potential is supplied to the shunt switch SS[x]B which is in the on state. The control signal Con[x] of the negative potential is supplied to the through-switch TS[x]B which is in the off state. The control signal Con[x]/ of the negative potential is supplied to the shunt switch SS[x]B which is in the off state.

Owing to such a configuration, in the through-switches TS1B to TS[n]B to which the control signals Con1 to Con[n] of the negative potential are supplied and the shunt switches SS1B to SS[n]B to which the control signals Con1/ to Con[n]/ of the negative potential are supplied, the negative potential is applied to the body in each of the first MOSFETs T11 to T1[p] and the second MOSFETs S11 to S1[p] via the first diode D3 or the second diode D4.

Accordingly, similar to the second embodiment, it is possible to improve the maximum allowable input power.

In addition, according to the exemplary embodiment, since the voltage of the body is controlled via the first diode D3 or the second diode D4, it is not necessary to provide the body control line, and to supply the body control voltage as well. Accordingly, it is possible to simplify the configuration and control as compared with the second embodiment.

Note that, by switching the connecting position of each of the first first diode D3 to the p-th first diode D3 with the connecting position of each of the first first resistor Rb1T to the p-th first resistor Rb[p]T, the first first diode D3 to the p-th first diode D3 may be connected to the body, and the first resistors Rb1T to Rb[p]T may be connected to the gate. In the same way, by switching the connecting position of each of the first second diode D4 to the p-th second diode D4 with the connecting position of each of the first second resistor Rb1S to the p-th second resistor Rb[p]S, the first second diode D4 to the p-th second diode D4 may be connected to the body, and the second resistors Rb1S to Rb[p]S may be connected to the gate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor switch, comprising:
   a support substrate;
   an insulating layer on the support substrate;
   a semiconductor layer on the insulating layer; and
   i-th first switches, where i is an integer value 1 to n, where n is an integer of 2 or more, on the semiconductor layer and configured to switch conduction between a common node and a respective i-th input-output node, wherein
   at least one i-th first switch includes a plurality of first metal-oxide-semiconductor field effect transistors (MOSFETs) connected in series between the common node and the respective i-th input-output node, and
   each of the plurality of first MOSFETs includes:
      a plurality of first gate electrodes extending in a first direction along the semiconductor layer;
      a second gate electrode extending in a second direction intersecting the first direction, each of the plurality of first gate electrodes having a first end contacting the second gate electrode and a second end distal in the first direction from the second gate electrode;
      a first region of the semiconductor layer having a first conductivity type between, in the second direction, the plurality of first gate electrodes;
      a second region of the semiconductor layer having the first conductivity type on a side of the second gate electrode opposite to the plurality of first gate electrodes in the first direction;
      a first wiring in each of the plurality of first regions and extending in the first direction;
      a second wiring in the second region, connected to every other end portion of the plurality of first wirings, and extending in the second direction; and
      a contact that electrically connects the second region and the second wiring.

2. The semiconductor switch according to claim 1, wherein a j-th one of the i-th first switches, where j is an integer value of 2 to n, that does not include a plurality of first MOSFETs, includes:
   a plurality of second MOSFETs that are connected in series between the common node and a respective j-th one of the i-th input-output nodes, each of the plurality of second MOSFETs having a first diode connected between a body and a gate.

3. The semiconductor switch according to claim 2, further comprising:
   i-th second switches on the semiconductor layer and configured to switch conduction between a reference potential node and the respective i-th input-output node, wherein
   the i-th second switches include:
      a plurality of third MOSFETs connected in series between the reference potential node and the respective i-th input-output node, each of the plurality of third MOSFETs having a second diode connected between a body and a gate.

4. The semiconductor switch according to claim 3, wherein the number of first MOSFETs in the plurality of first MOSFETs in the at least one i-th first switch is greater than the number of second MOSFETs in the plurality of second MOSFETs in the j-th one of the i-th first switches, and
   the number of first MOSFETs in the plurality of first MOSFETs of the at least one of the i-th first switch is greater than the number of third MOSFETs in the plurality of third MOSFETs.

5. The semiconductor switch according to claim 3, wherein
   a gate voltage when the plurality of first MOSFETs are in a non-conduction state is greater than a gate voltage when the plurality of second MOSFETs are in a non-conduction state, and
   the gate voltage when the plurality of first MOSFETs are in the non-conduction state is greater than a gate voltage when the plurality of third MOSFETs are in a non-conduction state.

6. The semiconductor switch according to claim 1, wherein the common node is connected to an antenna.

7. The semiconductor device according to claim 1, wherein at least one of the i-th input-output nodes is connected to a global positioning system transceiver.

8. A semiconductor switch, comprising:
   a support substrate;
   an insulating layer on the support substrate;
   a semiconductor layer on the insulating layer;
   i-th first switches, where i is an integer value 1 to n, where n is an integer of 2 or more, on the semiconductor layer and configured to switch conduction between a common node and a respective i-th input-output node, wherein
   at least one i-th first switch includes a plurality of first metal-oxide-semiconductor field effect transistors (MOSFETs) connected in series between the common node and the respective i-th input-output node, and
   each of the plurality of first MOSFETs includes:
      a plurality of first gate electrodes extending in a first direction along the semiconductor layer;
      a second gate electrode extending in a second direction intersecting the first direction, each of the plurality of first gate electrodes having a first end contacting the second gate electrode and a second end distal in the first direction from the second gate electrode;

a first region of the semiconductor layer having a first conductivity type between, in the second direction, the plurality of first gate electrodes; and a second region of the semiconductor layer having the first conductivity type on a side of the second gate electrode opposite to the plurality of first gate electrodes in the first direction, wherein a j-th one of the i-th first switches, where j is an integer value of 2 to n, that does not include a plurality of first MOSFETs, includes:

a plurality of second MOSFETs that are connected in series between the common node and a respective j-th one of the i-th input-output nodes, each of the plurality of second MOSFETs having a first diode connected between a body and a gate; and i-th second switches on the semiconductor layer and configured to switch conduction between a reference potential node and the respective i-th input-output node, wherein the i-th second switches include:

a plurality of third MOSFETs connected in series between the reference potential node and the respective i-th input-output node, each of the plurality of third MOSFETs having a second diode connected between a body and a gate, wherein the number of first MOSFETs in the plurality of first MOSFETs in the at least one i-th first switch is greater than the number of second MOSFETs in the plurality of second MOSFETs in the j-th one of the i-th first switches, and the number of first MOSFETs in the plurality of first MOSFETs of the at least one of the i-th first switch is greater than the number of third MOSFETs in the plurality of third MOSFETs.

9. The semiconductor switch according to claim 8, wherein the common node is connected to an antenna.

10. The semiconductor device according to claim 8, wherein at least one of the i-th input-output nodes is connected to a global positioning system transceiver.

11. A semiconductor switch, comprising:

a support substrate;

an insulating layer on the support substrate;

a semiconductor layer on the insulating layer;

i-th first switches, where i is an integer value 1 to n, where n is an integer of 2 or more, on the semiconductor layer and configured to switch conduction between a common node and a respective i-th input-output node, wherein at least one i-th first switch includes a plurality of first metal-oxide-semiconductor field effect transistors (MOSFETs) connected in series between the common node and the respective i-th input-output node, and each of the plurality of first MOSFETs includes:

a plurality of first gate electrodes extending in a first direction along the semiconductor layer;

a second gate electrode extending in a second direction intersecting the first direction, each of the plurality of first gate electrodes having a first end contacting the second gate electrode and a second end distal in the first direction from the second gate electrode;

a first region of the semiconductor layer having a first conductivity type between, in the second direction, the plurality of first gate electrodes; and a second region of the semiconductor layer having the first conductivity type on a side of the second gate electrode opposite to the plurality of first gate electrodes in the first direction, wherein a j-th one of the i-th first switches, where j is an integer value of 2 to n, that does not include a plurality of first MOSFETs, includes:

a plurality of second MOSFETs that are connected in series between the common node and a respective j-th one of the i-th input-output nodes, each of the plurality of second MOSFETs having a first diode connected between a body and a gate; and i-th second switches on the semiconductor layer and configured to switch conduction between a reference potential node and the respective i-th input-output node, wherein the i-th second switches include:

a plurality of third MOSFETs connected in series between the reference potential node and the respective i-th input-output node, each of the plurality of third MOSFETs having a second diode connected between a body and a gate, wherein a gate voltage when the plurality of first MOSFETs are in a non-conduction state is greater than a gate voltage when the plurality of second MOSFETs are in a non-conduction state, and the gate voltage when the plurality of first MOSFETs are in the non-conduction state is greater than a gate voltage when the plurality of third MOSFETs are in a non-conduction state.

12. The semiconductor switch according to claim 11, wherein the common node is connected to an antenna.

13. The semiconductor device according to claim 11, wherein at least one of the i-th input-output nodes is connected to a global positioning system transceiver.

* * * * *